US009496049B2

(12) United States Patent
Gremillet

(10) Patent No.: US 9,496,049 B2
(45) Date of Patent: Nov. 15, 2016

(54) COMPACT SAMPLE-AND-HOLD DEVICE

(71) Applicant: THALES, Courbevoie (FR)

(72) Inventor: Patrick Gremillet, Bazainville (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/889,813

(22) PCT Filed: May 14, 2014

(86) PCT No.: PCT/EP2014/059890
§ 371 (c)(1),
(2) Date: Nov. 6, 2015

(87) PCT Pub. No.: WO2014/184267
PCT Pub. Date: Nov. 20, 2014

(65) Prior Publication Data
US 2016/0148706 A1 May 26, 2016

(30) Foreign Application Priority Data
May 15, 2013 (FR) ...................... 13 01115

(51) Int. Cl.
*G11C 27/02* (2006.01)
*H03K 5/00* (2006.01)

(52) U.S. Cl.
CPC ................... *G11C 27/024* (2013.01)

(58) Field of Classification Search
CPC .................................... G11C 27/024
USPC ..................... 327/94–96, 362, 65; 330/51, 9, 330/250–253
See application file for complete search history.

(56) References Cited

U.S. PATENT DOCUMENTS 3,643,110 A 2/1972 Thompson
4,801,823 A * 1/1989 Yokoyama ........... G11C 27/026
327/95
4,806,790 A * 2/1989 Sone .................... G11C 27/026
327/321
4,873,457 A * 10/1989 Sanielevici .......... G11C 27/026
327/362
5,180,932 A * 1/1993 Bengel ................ G11C 27/026
327/362

(Continued)

FOREIGN PATENT DOCUMENTS

EP 1 074 996 A1 2/2001

*Primary Examiner* — Lincoln Donovan
*Assistant Examiner* — Thomas Skibinski
(74) *Attorney, Agent, or Firm* — Baker & Hostetler LLP

(57) ABSTRACT

The sample-and-hold device comprises a holding capacitor and operates according to a track phase during which the voltage on the terminals of the capacitor tracks the input signal and according to a hold phase during which the capacitor is isolated from the input signal, it comprises: a differential pair comprising a first transistor Q1 and a second transistor Q2 connected as common emitters, the collector of the transistor Q2 being connected to the holding capacitor, the input signal being applied to the base of the transistor Q1; a third transistor Q3, of which the base is connected to the collector of the transistor Q2 and the emitter is connected to the base of the transistor Q2, the signal present on the emitter of the transistor Q3 forming the output signal of the sample-and-hold device; a current source I connected to the collector of the transistor Q2; during the track phase, the differential pair Q1, Q2 being supplied by a current 2I, the transistor Q2 being charged by the current source and by the holding capacitor, during the hold phase, the current 2I supplying the differential pair Q1, Q2 being disconnected and the holding capacitor being charged by two opposite currents having the same value, equal to the current I of the source.

8 Claims, 6 Drawing Sheets

(56) References Cited

U.S. PATENT DOCUMENTS

| | | | |
|---|---|---|---|
| 5,227,676 A * | 7/1993 | Bahr | G11C 27/028 327/362 |
| 6,285,220 B1 | 9/2001 | Gaillard et al. | |
| 6,825,697 B1 * | 11/2004 | Linder | G11C 27/026 327/94 |
| 2006/0220693 A1 * | 10/2006 | Morisson | G11C 27/026 327/94 |
| 2009/0219059 A1 * | 9/2009 | Corsi | G11C 27/026 327/94 |

* cited by examiner

COMPACT SAMPLE-AND-HOLD DEVICE

CROSS-REFERENCE TO RELATED APPLICATIONS

This application is a National Stage of International patent application PCT/EP2014/059890, filed on May 14, 2014, which claims priority to foreign French patent application No. FR 1301115, filed on May 15, 2013, the disclosures of which are incorporated by reference in their entirety.

FIELD OF THE INVENTION

The present invention relates to a compact sample-and-hold device. It applies notably to input stages of high-speed analog-to-digital converters.

BACKGROUND

High speed analog-to-digital converters used to digitize sensor signals, notably in the field of radar or telecommunications, have an input stage comprising a sample-and-hold device allowing the input signal to be frozen during the quantification phase. The performance of the converters therefore depends heavily on the performance of the sample-and-hold device.

The sample-and-hold process consists in charging a capacitor, referred to as a holding capacitor, during a first phase of tracking or sampling the input signal, and in isolating this capacitor from the input signal which may continue to vary, thus blocking the value of the voltage on the capacitor terminals. The quantification of the signal can be carried out during a second hold phase.

A problem which arises lies in implementing this switching in such a way that the sampled signal reproduces the input signal as faithfully as possible at the blocking time.

Most known solutions use the switching of a diode or of a base-emitter junction. The diode is conducting in the track phase and is blocked by controlling the voltage on its anode during the hold phase.

A first solution is the diode bridge, notably described in J. R. Gray and S. C. Kitsopoulos "A Precision Sample-and-Hold Circuit with Subnanosecond Switching" IEEE Transactions on Circuit Theory, CT11, September 1964, pages 389-396, with multiple variants.

A switched-tracker solution, requiring only a current source, is preferred in integrated circuits. It is notably described in document U.S. Pat. No. 3,643,110, multiple variants being used.

These solutions have a number of disadvantages. In particular, a diode switching device is strongly non-linear.

During the reversal, an injection of charges into the holding capacitor occurs, introducing a parasitic voltage which is added to the signal, this voltage also being referred to as a "pedestal error".

Furthermore, the isolation between the input and the output is weak since the signal passes across the junction capacitor of the diode.

Finally, this type of switching device is necessarily:

preceded by an input stage in order to isolate the input, thus introducing an additional power consumption and non-linear effects;

followed by an output stage in order to isolate the capacitor, introducing an additional power consumption and introducing non-linear effects.

SUMMARY OF THE INVENTION

One object of the invention is notably to overcome the aforementioned disadvantages, in particular to enable a reduction in the non-linearities and power consumption. For this purpose, the subject-matter of the invention is a sample-and-hold device comprising a holding capacitor $C_H$, said sample-and-hold device operating according to a track phase during which the voltage on the terminals of said capacitor tracks the input signal Vin of said sample-and-hold device and according to a hold phase during which the capacitor is isolated from said input signal Vin, the sample-and-hold device comprising at least:

a differential pair comprising a first bipolar transistor Q1 and a second bipolar transistor Q2 connected as common emitters, the collector of the transistor Q2 being connected to the holding capacitor $C_H$, the input signal (Vin) being applied to the base of the transistor Q1;

a third bipolar transistor Q3, of which the base is connected to the collector of the transistor Q2 and the emitter is connected to the base of the transistor Q2, the signal present on the emitter of the transistor Q3 forming the output signal Vout of said sample-and-hold device;

a current source connected to the collector of the transistor Q2;

during the track phase, said differential pair Q1, Q2 being supplied by a current 2I, the transistor Q2 being charged by said current source (20) and by the holding capacitor $C_H$, during the hold phase, the current 2I supplying the differential pair Q1, Q2 being disconnected and the holding capacitor $C_H$ being charged by two opposite currents having the same value, equal to the current of said source.

The charging current of the holding capacitor $C_H$ opposite to the current of said source is, for example, obtained by switching a part of the current 2I supplying the differential pair over to said capacitor.

The part of the current 2I is, for example, equal to half of the current 2I supplying the differential pair.

In one particular embodiment:

the current source 2I of the differential pair in the track phase is implemented by two bipolar transistors Q4, Q6, each in series with a current source, the collectors of the transistors Q4 and Q6 being connected to the emitters of the transistors Q1, Q2 of said differential pair, the transistors Q4 and Q6 being controlled to open during the track phase and to close during the hold phase;

the current source in the hold phase being implemented by a different bipolar transistor Q5 in series with the current source of the transistor Q4, the collector of the transistor Q5 being connected to the holding capacitor $C_H$, the transistor Q5 being controlled to open during the hold phase and to close during the track phase.

The sample-and-hold device comprises, for example, a bipolar transistor Q7 connected in series with the current source of the transistor Q6, the transistor Q7 being controlled to open during the hold phase and to close during the track phase.

In one possible alternative embodiment, a differential pair of bipolar transistors Q8, Q9 is connected in series with the transistor Q7, the base and the collector of the transistor Q8 being connected to the emitters of the transistors Q1 and Q2, the collector of the transistor Q9 being connected to the collector of the transistor Q1 and its base being connected to the base of the transistor Q2.

In a different possible alternative embodiment, a bipolar transistor Q10 is inserted between the input point suitable for receiving the input signal Vin and the base of the transistor Q1, the emitter of the transistor Q10 being connected to the base of the transistor Q1, the input signal (Vin) being applied to the base of the transistor Q10.

In a different possible embodiment, a transistor Q11 is connected between the holding capacitor ($C_H$) and the transistor Q5, the emitter of the transistor Q11 being connected to the collector of the transistor Q5.

BRIEF DESCRIPTION OF THE DRAWINGS

Other characteristics and advantages of the invention will become evident from the description which follows, given with reference to the attached drawings, in which.

DETAILED DESCRIPTION

Figure 1:
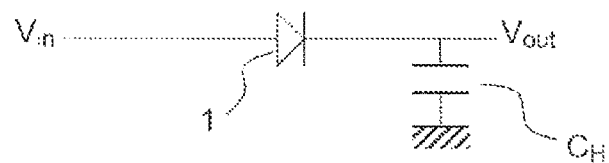
FIG. 1 shows the principle of the sample-and-hold device.

FIG. 1 shows the principle of the sample-and-hold device consisting in charging a capacitor $C_H$, referred to as a holding capacitor, during a first phase of tracking the input voltage Vin, and in isolating this capacitor from this same input signal during a second hold phase. FIG. 1 shows a basic example embodiment used in most sample-and-hold systems, using the switching of a diode or of a base-emitter junction. The diode 1 is conducting in track mode, the output voltage Vout being equal to the input voltage Vin to within the junction voltage. During this phase, a capacitor $C_H$, connected between the cathode of the diode and a reference potential, is charged to the output voltage Vout. The diode is blocked in hold mode, isolating the capacitor from the input voltage, during which phase the voltage on the terminals of the capacitor, equal to Vout, remains held at the value of the input voltage at the time of the switching of the diode, switching from the conducting state to the blocked state. The transition to the blocked state is controlled by a reverse voltage applied between the anode and the cathode of the diode. The control of this reverse voltage enables the control of the sample-and-hold device.

As previously indicated, a diode switching device or base-emitter junction switching device is strongly non-linear. In particular, when the reverse voltage is applied, charges are injected into the holding capacitor $C_H$, introducing a parasitic voltage which is added to the signal. Furthermore, the isolation between the input and the output is weak due to the junction capacitor of the diode 1, particularly at high frequencies. Finally, it should be remembered that a diode switching device of this type must be preceded by an input stage in order to isolate it and an output stage in order to isolate the capacitor. These stages cause an additional power consumption and additional non-linearities.

Figure 2:
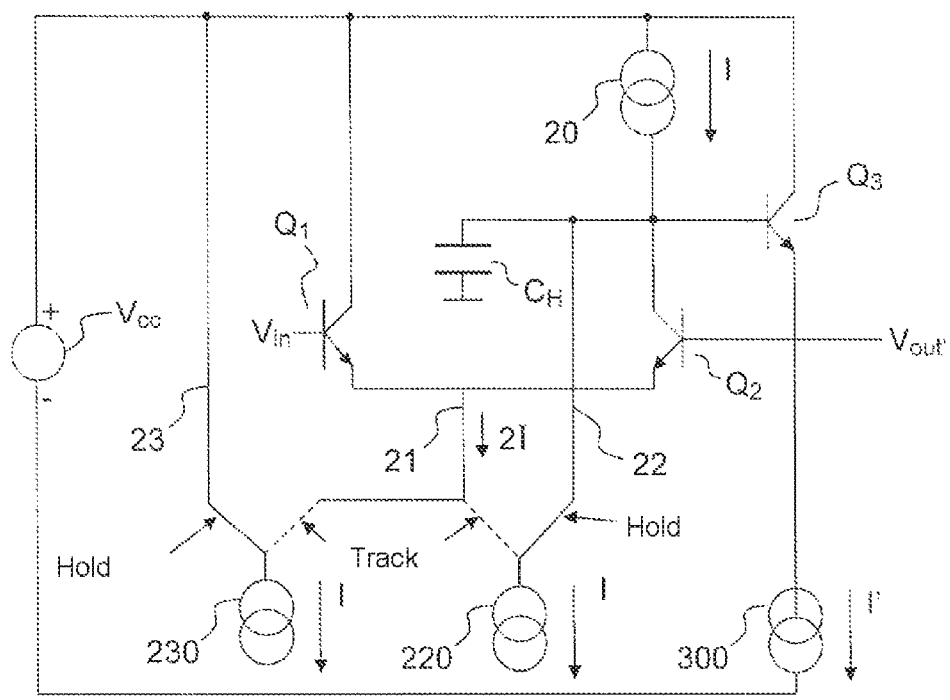
FIG. 2 shows the implementation principle of a sample-and-hold device according to the invention.

FIG. 2 shows the implementation principle of a sample-and-hold device according to the invention. The invention consists notably in charging and discharging the holding capacitor via a current source controlled by the input signal in such a way that the output voltage on the terminals of the holding capacitor tracks the input signal, and in disconnecting the current source during the blocking phase. The charging and discharging of the holding capacitor are carried out entirely by current sources.

A sample-and-hold device according to the invention thus comprises a differential pair Q1, Q2 made up of two NPN bipolar transistors connected as common emitters. The input of the signal Vin is effected on the base of the first transistor Q1. The collector of the second transistor Q2 is connected to the holding capacitor $C_H$.

The base of the second transistor of the pair, Q2, is looped back onto the emitter of a third NPN bipolar transistor Q3, mounted in track mode. The function of this transistor Q3 is notably to track the voltage present on the collector of Q2, its base being connected thereto.

During the track phase, referred to below as track mode, the differential pair is supplied by a current 2I via a channel 21, the transistor Q2 being charged by a source 20 of current I and by the holding capacitor $C_H$. Through this assembly, the invention consists notably in charging the holding capacitor $C_H$ via a current source controlled by the input signal Vin in such a way that the output voltage Vout' on the terminals of the holding capacitor $C_H$ tracks the input signal Vin.

The transition from track mode to blocked mode, corresponding to the hold phase, is effected by disconnecting the channel 21 from the current 2I supplying the differential pair Q1, Q2 and diverting one half toward the holding capacitor via a different channel 22 in such a way that this capacitor is charged by two constant and opposite currents which have the same value. The voltage on the terminals of the capacitor is then held at the value Vout', equal to the value Vin at the time of the switching of the channels 21, 22, increased by the base-emitter voltage of Q3. The output voltage Vout is taken at the output of the emitter of the transistor Q3 which tracks the voltage present on the collector of Q2, i.e. the voltage present on the holding capacitor $C_H$, and finally Vin.

A third channel 23 is, for example, provided to conduct the other half of the current 2I not used for the blocking of the capacitor voltage. Current sources 220, 230 are connected in series to the channels 21, 22, 23 according to whether the device is in track mode or hold mode. A residual current I' at the output of the emitter of the transistor Q3 is regulated in a current source 300 connected in series to the emitter of the transistor Q3.

The assembly of components is connected to the terminals of a power supply source Vcc, the currents being supplied by said source. More particularly, the collectors of the transistors Q1 et Q3 are connected to the positive terminal of Vcc. The current source 20 is connected between the positive terminal of Vcc and the transistor Q2. The voltage references are taken in relation to the negative terminal of Vcc.

With a holding capacitor $C_H$ on the collector of the transistor Q2, a structure is thus provided where the input Vin and the output Vout are isolated from the holding capacitor, eliminating the need for an input stage and an output stage, which are sources of non-linearities and power consumption.

More particularly, the invention provides a structure which combines the switching device, the input stage and the output stage. The invention thus advantageously enables the implementation of a compact sample-and-hold device having very good energy and linearity performance.

Figure 3A:
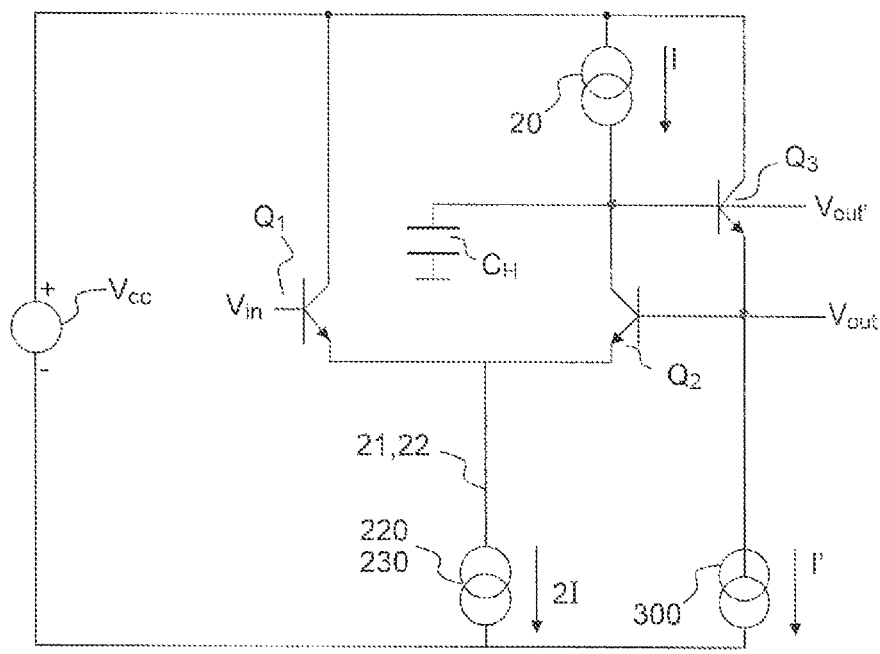
FIGS. 3a and 3b show illustrations of the respective operations in track mode and in hold mode.
Figure 3B:
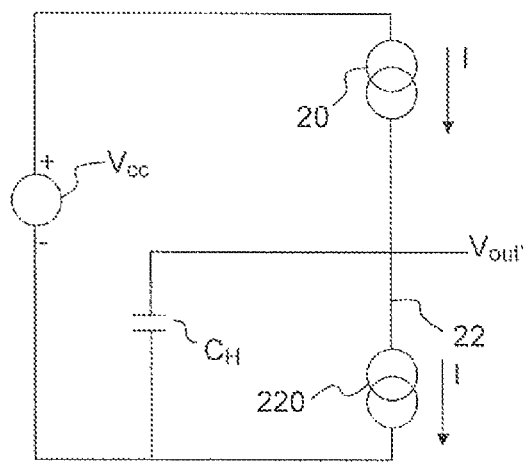

FIGS. 3a and 3b show respectively the equivalent electrical diagram of the device shown in FIG. 2 for track mode and for hold mode, for the establishment of the voltage on the terminals of the capacitor $C_H$. In the track mode shown in FIG. 3a, the differential pair Q1, Q2 is supplied by a current 2I via the channels 21, 22, the transistor Q2 being charged by a current I and by the holding capacitor $C_H$ of which the voltage on the terminals tracks the input voltage Vin.

In the hold mode shown in FIG. 3b, the channels 21, 22, 23 have been switched in such a way as to disconnect the current 2I supplying the differential pair, the latter no longer being supplied. One half of the current is diverted toward the holding capacitor $C_H$ via the channel 22 in such a way that this capacitor is charged by two opposite constant currents, the current I supplied by the source 20 being connected to the collector of the transistor Q2 and the current I flowing toward the source 220 of the channel the 22.

Figure 4:
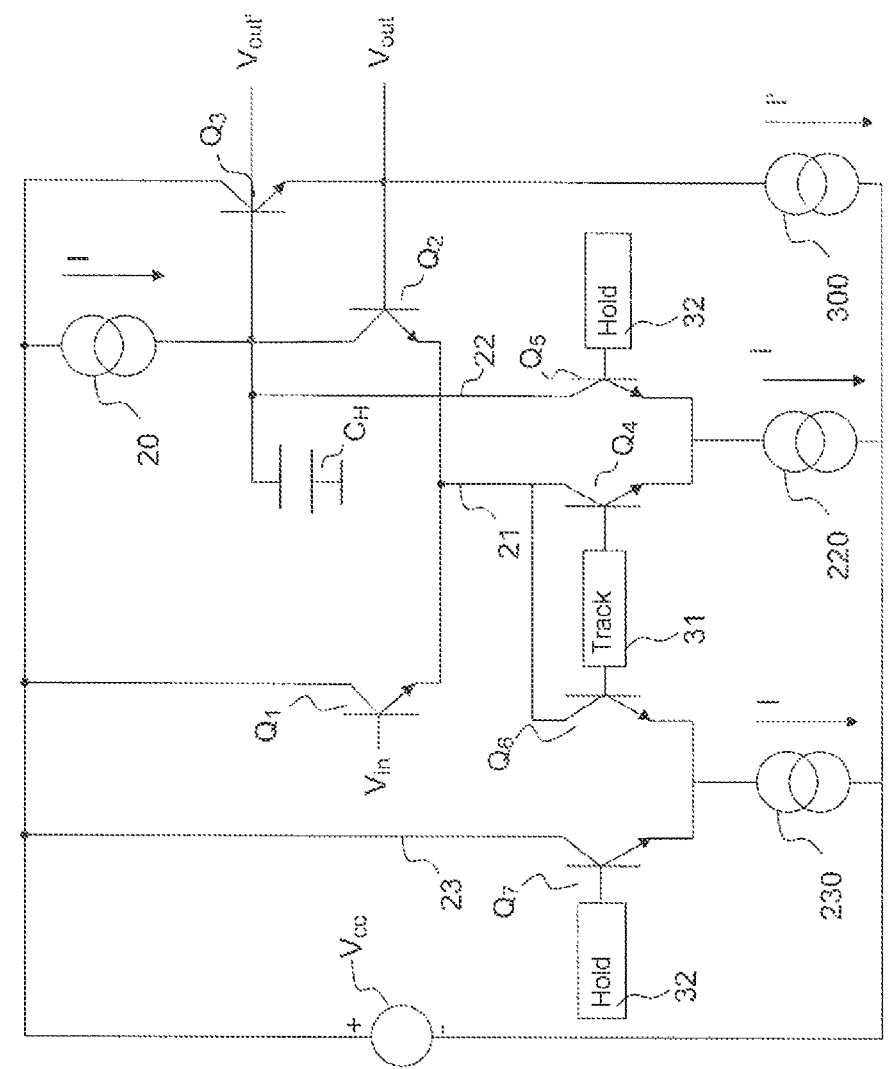
FIG. 4 shows a first example embodiment of a sampler according to the invention.

FIG. 4 shows a possible example embodiment of the sample-and-hold device according to the invention, operating according to the principle shown in the diagram in FIG. 2. In this example embodiment, the current source 2I which supplies the differential pair Q1 Q2 is implemented by two transistors Q4, Q6. These two transistors are connected to the differential pair via the channel 21 supplying the current 2I. More particularly, the collector of the transistor Q4 and the collector of the transistor Q6 are connected to the emitters of the transistors Q1, Q2. The current source 2I is formed from two sources of current I, one being implemented by the transistor Q4 in series with a first source 220, and the other by the transistor Q6 in series with a second source 230. To represent the formation of these sources, said sources are shown symbolically in FIG. 4 and are connected to the transistors Q4 and Q6. The emitter of the transistor Q4 is thus connected to the first current source 220 and the emitter of the transistor Q6 is connected to the second current source 230. This method of representation will be retained for the following figures.

In hold mode, the source of the current I is implemented by a transistor Q5 which diverts a part of the current 2I which supplies the differential pair. To do this, the collector of the transistor Q5 is connected to a terminal of the holding capacitor $C_H$ and its emitter is connected in series with the previously mentioned first current source 220, the transistors Q4 and Q5 being connected as common emitters. The other terminal of the capacitor $C_H$ is connected to the reference potential of the source Vcc.

A transistor Q7 enables the diversion of the other half of the current 2I, not assigned to the holding capacitor $C_H$, during hold mode. To do this, the collector of the transistor Q7 is connected to the positive terminal of the power supply source Vcc and its emitter is connected to the previously mentioned second current source 230, the transistors Q6 and Q7 being connected as common emitters.

Signals 31, 32, 33 control the bases of the transistors Q4, Q5, Q6 and Q7 to control the switching from one mode to the other. In track mode, a signal 31 controls the transistors Q4 and Q6 to open, whereas a signal 32 controls the transistors Q5 and Q7 to close. The current 2I then supplies the differential pair.

In hold mode, these controls are reversed, the transistors Q4 and Q6 being controlled to close and the transistors Q5 and Q7 being controlled to open. One half of the current 2I is diverted by the transistor Q5, this current being opposite to the current I supplied by the source 20, the holding capacitor then being charged by two constant and opposite currents I.

Figure 5:
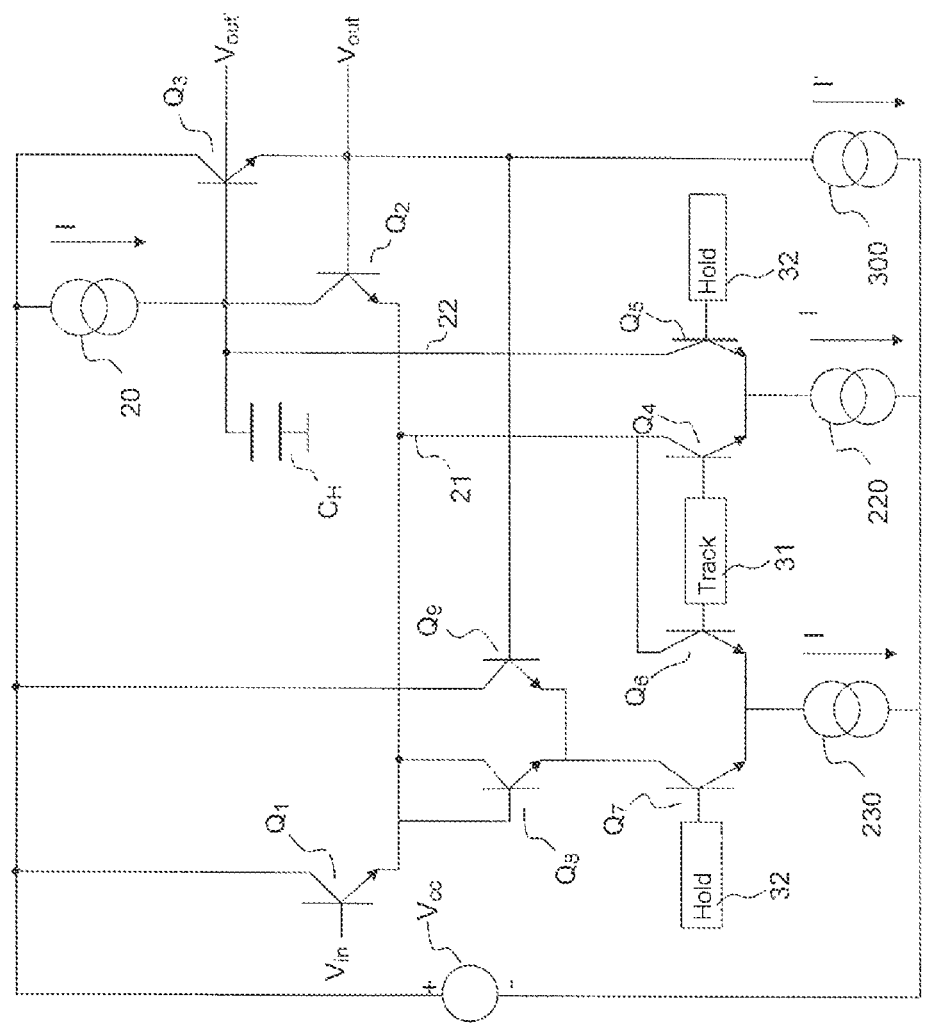
FIGS. 5 to 7 show possible alternative embodiments of the sample-and-hold device as shown in FIG. 4.

FIG. 5 shows an alternative embodiment to the embodiment shown in FIG. 4. In this alternative embodiment, the emitter voltage of the differential pair Q1, Q2 is held constant during the hold phase in such a way that the transistors are effectively blocked. This emitter voltage is held constant by the addition of a differential pair comprising a transistor Q8 and a transistor Q9, the base and the collector of Q8 being connected to the emitters of Q1 and Q2, the collector of Q9 being connected to the positive terminal of Vcc, the base of Q9 being connected to the base of Q2, the emitters of Q8 and Q9 being connected to the collector of the transistor Q7.

During the hold phase, the current I flows in the transistor Q7 and in the transistor Q9. The emitter voltage of the transistors Q1 and Q2 is held constant, equal to the output voltage Vout via the base-emitter voltages of the transistors Q8 and Q9.

Figure 6:
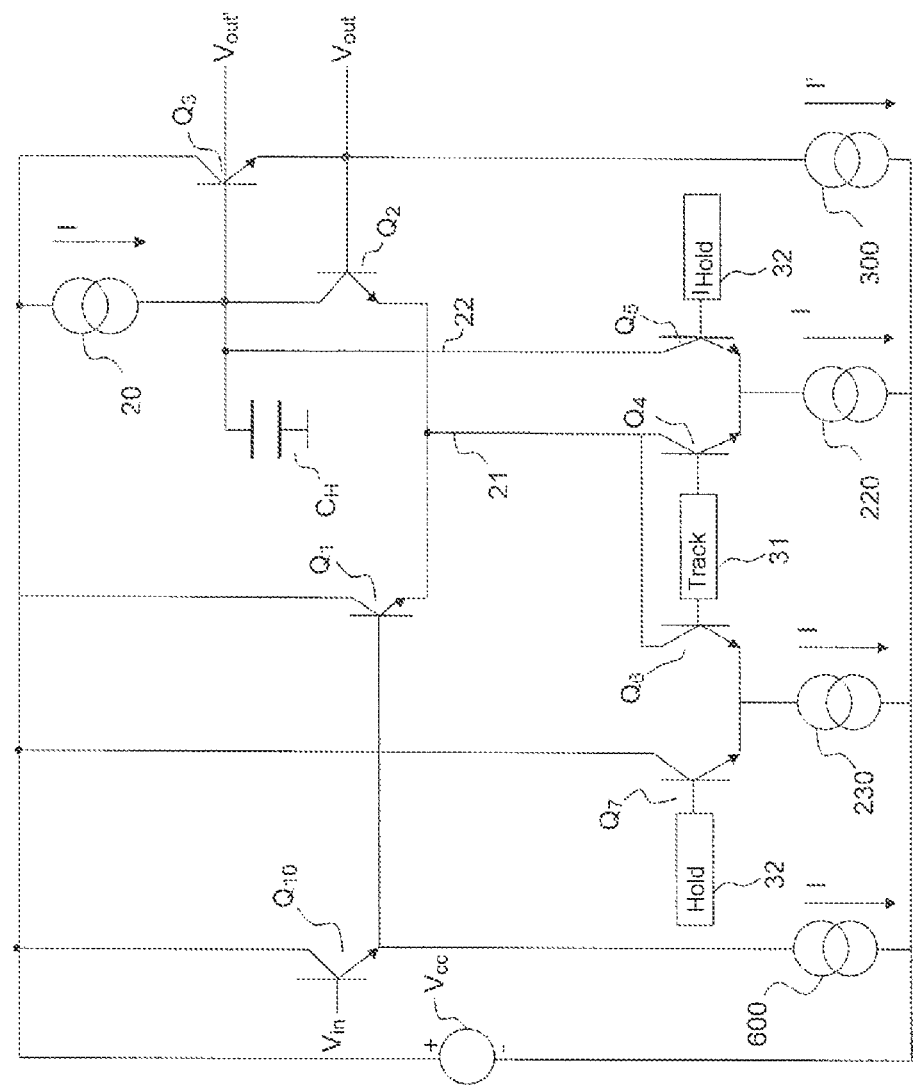

La FIG. 6 shows a different alternative embodiment compared with the embodiment shown in FIG. 4. In this alternative embodiment, a tracking stage is added at the input. This tracking stage replicates the output tracking stage and allows the device assembly to be made symmetrical. For this purpose, a transistor Q10 mounted as a tracker is inserted between the input of the signal Vin and the base of the transistor Q1. More particularly, the input signal Vin arrives on the base of the transistor Q10, the collector of Q10 being connected to the positive terminal of Vcc and its emitter being connected to the base of the transistor Q1. In order to make the assembly symmetrical and control the current, the emitter of the transistor Q10 is furthermore connected to a source 600 of current I', similar to the source 300 connected to the output tracker.

Figure 7:
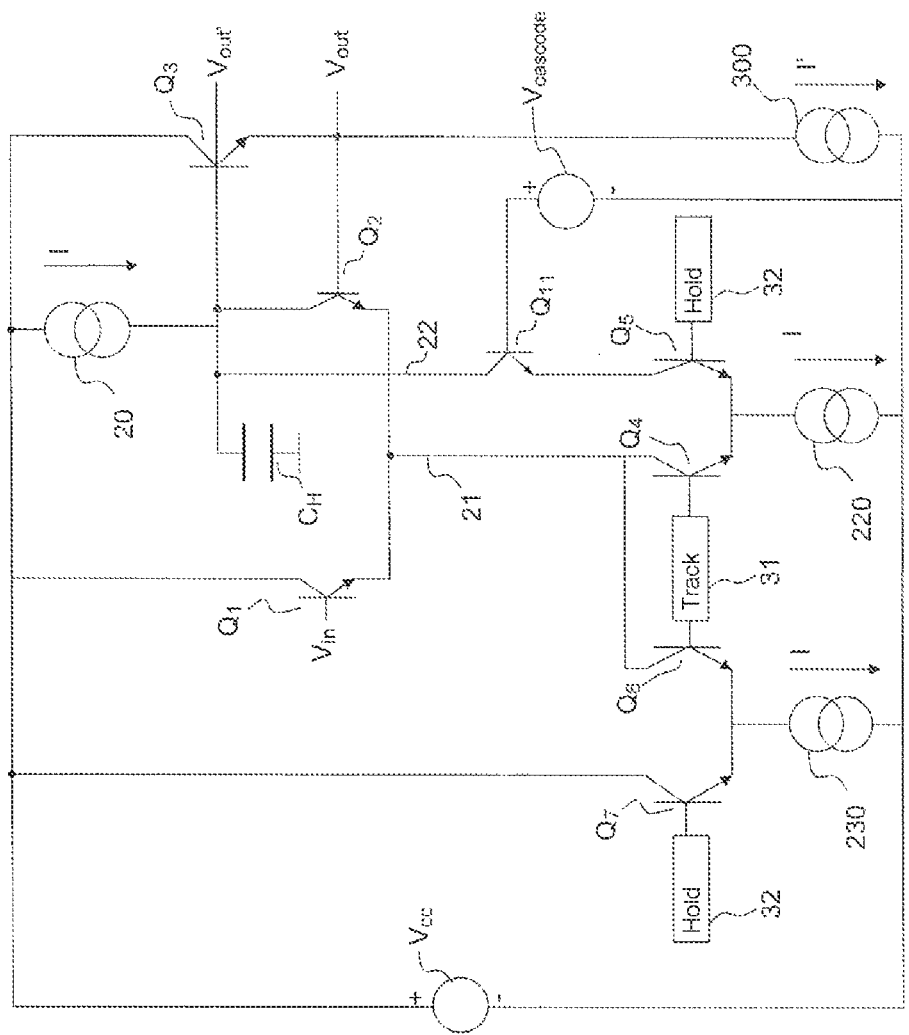

FIG. 7 shows a different alternative embodiment compared with the embodiment shown in FIG. 4. In this alternative embodiment, a transistor Q11 is mounted in a cascode configuration with the transistor Q5 in such a way as to isolate the holding capacitor $C_H$ even more effectively from the control variations 31, 32. To do this, the collector of the transistor Q11 is connected to the holding capacitor $C_H$ and its emitter is connected to the collector of the transistor Q5. The transistor Q11 is controlled to open by means of a voltage $V_{cascode}$ connected between its base and the reference potential.

Other alternative embodiments can also be provided. In particular, so that the currents cancel one another perfectly in the holding capacitor $C_H$, a base current compensation system, notably as described in document EP1074996, or a system for automatic adjustment of the static currents on start-up or in real time can be added. All of these alternative embodiments, notably those presented in relation to FIGS. 5 to 7 can be combined.

The invention claimed is:

1. A sample-and-hold device comprising a holding capacitor, said sample-and-hold device operating according to a track phase during which the voltage on the terminals of said capacitor tracks the input signal of said sample-and-hold device and according to a hold phase during which the capacitor is isolated from said input signal, said sample-and-hold device comprising at least:
   a differential pair comprising a first bipolar transistor Q1 and a second bipolar transistor Q2 connected as common emitters, the collector of the transistor Q2 being connected to the holding capacitor, the input signal being applied to the base of the transistor Q1;
   a third bipolar transistor Q3, of which the base is connected to the collector of the transistor Q2 and the emitter is connected to the base of the transistor Q2, the signal present on the emitter of the transistor Q3 forming the output signal of said sample-and-hold device;
   a current source connected to the collector of the transistor Q2; during the track phase, said differential pair Q1, Q2 being supplied by a current 2I, the transistor Q2 being charged by said current source and by the holding capacitor, during the hold phase, the current 2I supplying the differential pair Q1, Q2 being disconnected and the holding capacitor being charged by two opposite currents having the same value, equal to the current of said source.

2. The sample-and-hold device as claimed in claim 1, wherein the charging current of the holding capacitor opposite to the current of said source is obtained by switching a part of the current 2I supplying the differential pair over to said capacitor.

3. The sample-and-hold device as claimed in claim 2, wherein said part of the current 2I is equal to half of the current 2I supplying the differential pair.

4. The sample-and-hold device as claimed in claim 3, wherein:
  the current source 2I of the differential pair in the track phase is implemented by two bipolar transistors Q4, Q6, each in series with a current source, the collectors of the transistors Q4 and Q6 being connected to the emitters of the transistors Q1, Q2 of said differential pair, the transistors Q4 and Q6 being controlled to open during the track phase and to close during the hold phase;
  the current source in the hold phase being implemented by a different bipolar transistor Q5 in series with the current source of the transistor Q4, the collector of the transistor Q5 being connected to the holding capacitor, the transistor Q5 being controlled to open during the hold phase and to close during the track phase.

5. The sample-and-hold device as claimed in claim 4, comprising a bipolar transistor Q7 connected in series with the current source of the transistor Q6, the transistor Q7 being controlled to open during the hold phase and to close during the track phase.

6. The sample-and-hold device as claimed in claim 5, wherein a differential pair of bipolar transistors Q8, Q9 is connected in series with the transistor Q7, the base and the collector of the transistor Q8 being connected to the emitters of the transistors Q1 and Q2, the collector of the transistor Q9 being connected to the collector of the transistor Q1 and its base being connected to the base of the transistor Q2.

7. The sample-and-hold device according to claim 4, wherein a bipolar transistor Q10 is inserted between the input point suitable for receiving the input signal and the base of the transistor Q1, the emitter of the transistor Q10 being connected to the base of the transistor Q1, the input signal being applied to the base of the Q10.

8. The sample-and-hold device according to claim 4, wherein a transistor Q11 is connected between the holding capacitor and the transistor Q5, the emitter of the transistor Q11 being connected to the collector of the transistor Q5.

* * * * *